United States Patent [19]
Koitsalu

[11] Patent Number: 5,978,239
[45] Date of Patent: Nov. 2, 1999

[54] ARRANGEMENT AND METHOD IN A TELECOMMUNICATION SYSTEM FOR OPTICAL VOLTAGE MULTIPLICATIONING IN AN INTEGRATED CIRCUIT

[75] Inventor: Evald Koitsalu, Huddinge, Sweden

[73] Assignee: Telefonaktiebolaget LM Ericsson, Stockholm, Sweden

[21] Appl. No.: 08/894,730
[22] PCT Filed: Feb. 22, 1996
[86] PCT No.: PCT/SE96/00242
  § 371 Date: Aug. 27, 1997
  § 102(e) Date: Aug. 27, 1997
[87] PCT Pub. No.: WO96/27211
  PCT Pub. Date: Sep. 6, 1996

[30] Foreign Application Priority Data

Feb. 28, 1995 [SE] Sweden .................................. 9500737

[51] Int. Cl.⁶ .................................................. H02M 3/16
[52] U.S. Cl. ........................................................ 363/60
[58] Field of Search ................................. 365/59, 60, 61; 323/282, 351, 902; 327/530, 536, 538, 540

[56] References Cited

U.S. PATENT DOCUMENTS

| 3,918,887 | 11/1975 | Lamprecht et al. ..................... 431/255 |
| 4,796,174 | 1/1989 | Nadd ......................................... 363/60 |
| 4,922,403 | 5/1990 | Feller ........................................ 363/60 |
| 4,982,317 | 1/1991 | Mauthe .................................... 363/60 |
| 5,282,122 | 1/1994 | Summer ................................... 363/21 |
| 5,313,384 | 5/1994 | Takeda et al. ........................... 363/60 |
| 5,838,557 | 11/1998 | Wood ....................................... 363/60 |

FOREIGN PATENT DOCUMENTS 0 554 186  8/1993  European Pat. Off. ...... H01L 27/144

OTHER PUBLICATIONS

Patnaikuni, Ramesh, et al., "Design and Analysis of an Optical–Powered On–Chip Power Supply", Proceedings of the 32$^{nd}$ Midwest Symposium on Circuits and Systems, Aug. 14–16, 1989, pp. 681–684.

Primary Examiner—Adolf Denske Berhane
Attorney, Agent, or Firm—Burns, Doane, Swecker & Mathis, L.L.P.

[57] ABSTRACT

A device for performing voltage conversion in an integrated circuit comprising a plurality of different components, one or more of which requires a voltage which differs from the supply voltage of the integrated circuit has two circuits. The first circuit is designed to convert a first voltage into an optical signal, which is emitted from at least one element in the first circuit. The second circuit has one or more photosensitive elements, which are designed to receive the optical signal and convert the optical signal into a second voltage that is different and electrically isolated from the first voltage.

15 Claims, 2 Drawing Sheets

ARRANGEMENT AND METHOD IN A TELECOMMUNICATION SYSTEM FOR OPTICAL VOLTAGE MULTIPLICATIONING IN AN INTEGRATED CIRCUIT

TECHNICAL SCOPE

The present invention relates to an arrangement for performing voltage conversion in an inter circuit comprising a plurality of different circuit components, one or more of which requires a voltage which differs from the supply voltage of the integrated circuit.

The invention also relates to a process for performing voltage conversion in an integrated circuit according to the aforementioned.

PRIOR ART

More or less comprehensive integrated circuits are an important constituent element in the sphere of telecommunications. In the sphere of radio communications, in particular, it is desirable, wherever possible, to use low supply voltages for this type of circuit in order thereby to reduce the power consumption in the circuit.

Certain types of Application Specific Integrated Circuits (ASIC's) contain components requiring second voltages, in some cases higher than he circuit supply voltage. The problem arises, inter alia, in LSI circuits which handle low-level radio signals. In the case of voltage controlled oscillators (VCO's), for example, a higher voltage is usually required for varactors incorporated in the circuit than that used in other parts of the circuit. In order that he supply voltage to the circuit does not have to be increased unnecessarily, a system is frequently used by means of which voltage conversion from a lower to a higher voltage is performed in the circuit by means of a voltage multiplier.

A common system for bringing about the said voltage multiplication is to use circuitry with capacitors integrated in the circuit or outside it. The said system is known, inter alia, from US-A-4 796 174, US-A-4 922 403 and US-A-4 982 317. A disadvantage to this known system is that the circuitry results in transients which are transmitted to other circuit elements and give rise to problems of interference in the latter.

DESCRIPTION OF THE INVENTION

The present invention is intended to solve the problem of achieving high voltages for selected components in integrated circuits, such as varactors, field-effect transistors and HF switching diodes. The invention is preferably used in LSI and VLSI circuits and means that high voltages can be achieved without the need to increase the circuit's supply voltage.

This is achieved in that an arrangement for performing optical voltage conversion is inter into the integrated circuit. The arrangement comprises a first circuit, which converts the voltage to be transformed into an optical signal. The said optical signal is detected by a number of photosensitive elements in a second circuit in the arrangement, whereupon the detected optical signal is converted to a voltage at the output of the second circuit. The voltage which is obtained at the output of the second circuit may have a higher level than the voltage entering the first circuit and the supply voltage to the integrated circuit. The light transmission between the first and second circuit of the arrangement is well screened so that the power losses in the circuit remain small. The ratio between input and output voltage from the circuit is influenced by the number of photosensitive elements in the second circuit.

The present invention also relates to a process for performing voltage conversion in an integrated circuit. In the process according to the invention a first voltage is converted into an optical signal. The latter may be incident to a second circuit and converted to a voltage, the level of which differs from that of the incident feed voltage and varies as a flnction of the deed light intensity.

An advantage of the solution according to the invention compared to the known system is that the voltage conversion can be performed for certain components in the integrated circuit without interfering with the rest of the circuit.

PREFERRED EMBODIMENT

Figure 1:
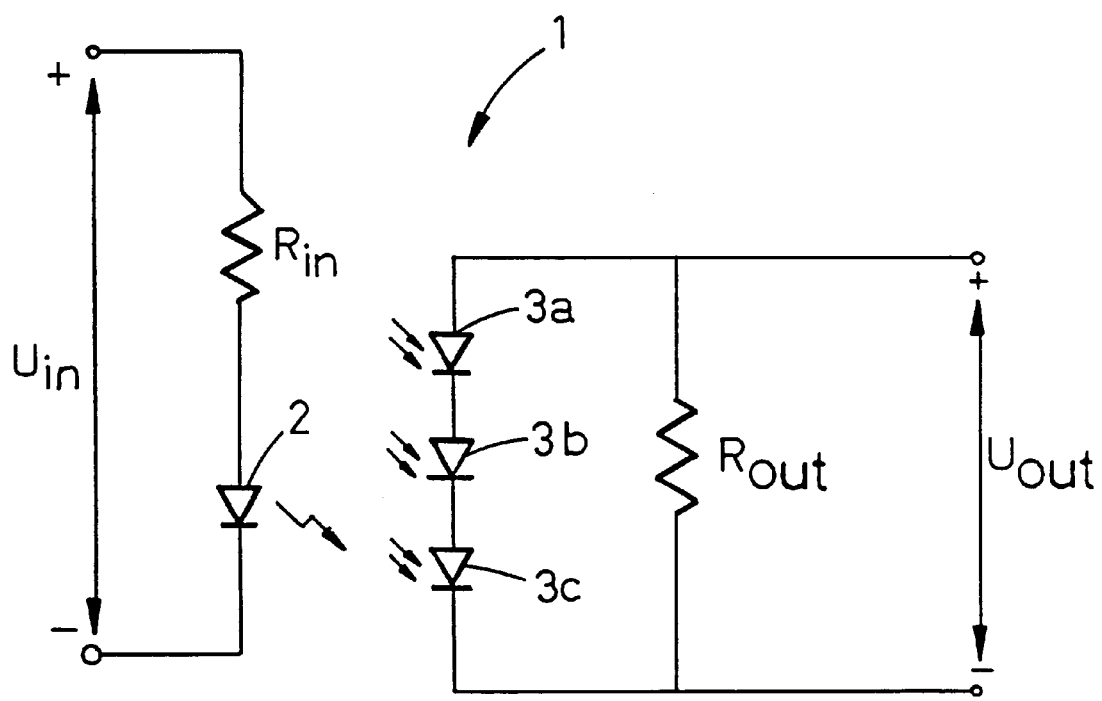
FIG. 1 shows a voltage multiplier for integration on a substrate in accordance with the invention.

The invention will be explained below with reference to FIG. 1, which shows a preferred embodiment of an optical voltage multiplier for integration in an LSI or VLSI circuit The voltage multiplier 1 comprises a primary side with a first circuit and a secondary side with a second circuit, which are electrically isolated from one another. The multiplier is preferably arranged closely connected to a component in the integrated circuit which requires a different voltage from the other components, that is a voltage which differs from the supply voltage; the required voltage may, for example, be higher than the supply voltage.

A first input voltage $u_{in}$, which does not exceed the supply voltage of the integrated circuit, is fed to the input of the first circuit on the primary side of the arrangement. In this circuit the said input voltage $u_{in}$ is converted into an optical signal, the light intensity of which corresponds to the current through the resistor $R_{in}$. In the embodiment shown this conversion occurs in a light emitting diode (LED) 2. The first and second circuit are jointly screened so that the optical signal from the first circuit cannot be diffused outside the said screening but can only be emitted to the second circuit.

The second circuit comprises a photovoltaic converter, which converts a received optical signal into a voltage. In the embodiment shown in the figure, the said photovoltaic converter is formed by a plurality of photodiodes 3a, 3b, 3c, which function by photovoltaic effect. The output voltage $u_{out}$ obtained at the output from the second circuit varies as a function both of the total number of photodiodes and of the incident light and hence of the input voltage $u_{in}$ at the input of the first circuit.

The ratio between the input and output voltages $u_{in}$, $u_{out}$ is controlled by the resistors $R_{in}$, $R_{out}$ shown in the figure, connected to both primary and secondary side of the arrangement. The current flowing in the said resistors is divided between the resistor $R_{in}$ connected to the first circuit and the resistor $R_{out}$ connected to the second circuit. Since the output voltage $u_{out}$ at the output from the second circuit is higher that the input voltage $u_{in}$ at the input to the first circuit, the current intensity in the resistor $R_{in}$ connected to the first circuit is higher than the current intensity in the resistor $R_{out}$ connected to the second circuit, seeing that no additional power is supplied during transformation. On the contrary, transformation naturally results in certain power losses, although where necessary these can be kept quite low. Voltage multiplication to a higher voltage level is therefore only possible in those circuits in which only very small currents are required.

By installing an arrangement for optical voltage multiplication in accordance with the invention, that is, for example, an optical coupler in an application-specific integrated circuit (ASIC), any additional voltage sources can be dispensed with.

Figure 2:
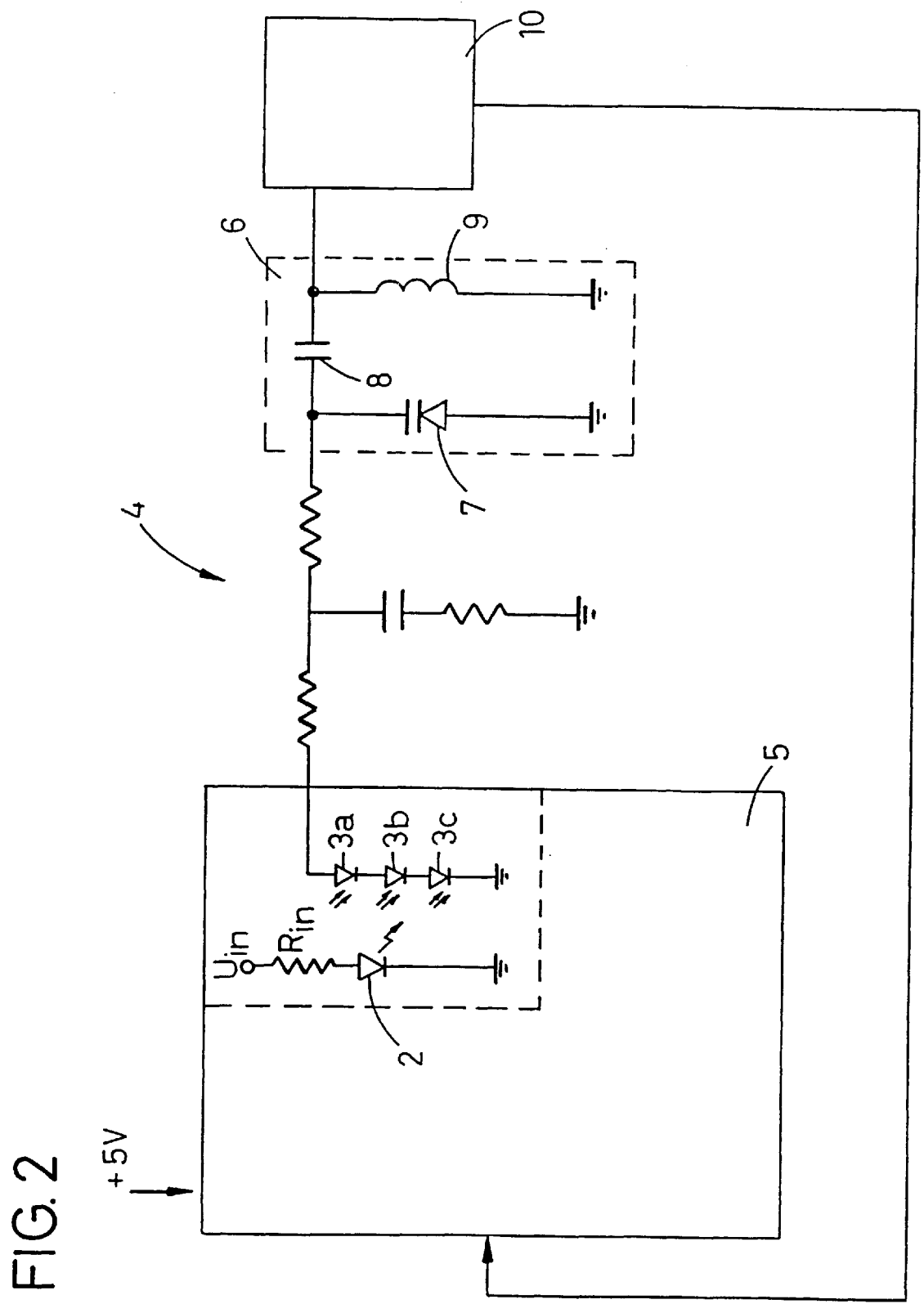
FIG. 2 shows a radio circuit in which the multiplier according to the invention can be appropriately used.

FIG. 2 shows a part of an application-specific integrated circuit for use in a radio circuit. The arrangement according to the invention is preferably used in integrated circuits with resonant circuits, as shown in the figures, since the integrated multiplier 1 according to the invention results in an advantageous multiplication of a certain voltage without transients occurring in the multiplication, thereby causing noise. FIG. 2 shows an optical voltage multiplier incorporated in an application-specific integrated circuit, in accordance with the invention. The voltage multiplier 1 may, for example, be incorporated in a phase locked loop (PLL circuit) 4 and used to transform the voltage to a higher level for supplying components around an oscillator part 10 of the circuit. A varactor 7, which is incorporated in a frequency-determining circuit 6, which is connected to the said oscillator part 10, constitutes one of the said components. The said frequency-determining circuit 6, or resonant circuit, also comprises a capacitor 8 and a coil 9. The varactor 7 requires a higher supply voltage than the other parts of the inter circuit 4 and the voltage must therefore be transformed in order to be able to control the varactor 7. On the so-called primary side of the voltage multiplier 1, an input voltage $u_{in}$, varying as a function of the +5V supply voltage, is converted to an optical signal m a light-emitting diode 2. The said optical signal is transmitted to the secondary side, it being possible to obtain a higher voltage by converting the optical signal to an electrical signal in one or more photodiodes 3a, 3b, 3c. Where necessary, the polarity of his voltage can also be reversed by connecting photodiodes 3a, 3b, 3c with reversed polarity.

The invention naturally also relates to an integrated circuit with a plurality of optical voltage multipliers, each of these being connected to any component requiring a higher voltage than the supply voltage, or a different polarity, but conversely only requiring a low current.

I claim:

1. Arrangement in an integrated circuit for performing voltage multiplication in the integrated circuit, which comprises a plurality of different circuit components, one or more of which requires a voltage which exceeds a supply voltage for the integrated circuit, but the current consumption of which is low, the arrangement comprising:

a first circuit, the first circuit designed to convert a first voltage into an optical signal, which is emitted from at least one element in the first circuit;

a second circuit, the second circuit comprising one or more photosensitive elements, which are designed to receive the optical signal and convert the optical signal into a second voltage which can be electrically isolated from the first voltage and differs therefrom;

wherein the said photosensitive element is designed to influence the voltage ratio, and the first and second circuit constitute a part of the integrated circuit and are arranged connected to a circuit component which requires a voltage other than the supply voltage of the integrated circuit.

2. Arrangement according to claim 1, wherein the second circuit is functionally connected to at least one varactor.

3. Arrangement according to claim 1, wherein the second circuit is functionally connected to at least one PIN diode switch.

4. Arrangement according to claim 1, wherein the second circuit is functionally connected to at least one field-effect transistor.

5. Arrangement according to claim 1, wherein the arrangement is incorporated in an integrated circuit of LSI type.

6. Arrangement according to claim 1, wherein the arrangement is incorporated in an integrated circuit of VLSI type.

7. Arrangement according to claim 1, wherein the first circuit comprises at least one light-emitting diode the second circuit comprises at least one photodiode of photovoltaic effect, and the at least one light-emitting diode and the at least one photodiode are screened so that essentially all light from the at least one light-emitting diode is incident upon the at least one photodiode.

8. A device as described in claim 1, the device further comprising a varactor that is electrically connected to the one or more photosensitive devices.

9. A device as described in claim 1, the device further comprising a PIN diode switch that is electrically connected to the one or more photosensitive devices.

10. A device as described in claim 1, the device further comprising a field-effect transistor that is electrically connected to the one or more photosensitive devices.

11. A device as described in claim 1, wherein the device is incorporated in an integrated circuit of LSI type.

12. A device as described in claim 1, wherein the device is incorporated in an integrated circuit of VLSI type.

13. A device as described in claim 1, wherein the light emitting source is a light-emitting diode, at least one photosensitive device is a photodiode of photovoltaic effect, and the light-emitting diode and the photosensitive diode are screened so that essentially all the light from the light-emitting diode is incident upon the photodiode.

14. Process for performing voltage multiplication in an integrated circuit, which comprises a plurality of different circuit components, one or more of which requires a voltage which differs in magnitude from a supply voltage for the integrated circuit or requires a different polarity to the latter, but the current consumption of which is low, the process comprising the steps of:

converting a first voltage for a first signal with a first current intensity into an optical signal;

feeding the optical signal to a photovoltaic converter, which converts the light received into a second voltage, which is electrically isolated from the first voltage.

15. A device for performing voltage conversion in an integrated circuit comprising a plurality of different circuit components, one or more of which requires a voltage which differs from the supply voltage of the integrated circuit, the device comprising:

a light emitting source, the light emitting source operable to convert a first voltage into an optical signal;

one or more photosensitive devices, the one or more photosensitive devices operable to convert the optical signal into a second voltage, the second voltage electrically isolated from the first voltage;

wherein the one or more photosensitive devices affect the ratio of the first voltage and the second voltage and the second voltage is connected to a circuit component which requires a voltage other than the supply voltage of the integrated circuit.

\* \* \* \* \*